United States Patent
Naito

(10) Patent No.: US 10,297,660 B2
(45) Date of Patent: May 21, 2019

(54) SEMICONDUCTOR DEVICE

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 13 days.

(21) Appl. No.: 15/687,558

(22) Filed: Aug. 28, 2017

(65) Prior Publication Data

US 2018/0069075 A1 Mar. 8, 2018

(30) Foreign Application Priority Data

Sep. 7, 2016 (JP) .................................. 2016-175099

(51) Int. Cl.
*H01L 29/06* (2006.01)
*H01L 27/06* (2006.01)
(Continued)

(52) U.S. Cl.
CPC ........ *H01L 29/063* (2013.01); *H01L 27/0664* (2013.01); *H01L 27/0727* (2013.01); *H01L 29/0834* (2013.01); *H01L 29/1095* (2013.01); *H01L 29/4238* (2013.01); *H01L 29/7397* (2013.01); *H01L 29/0696* (2013.01); *H01L 29/16* (2013.01); *H01L 29/1608* (2013.01); *H01L 29/2003* (2013.01); *H01L 29/407* (2013.01); *H01L 29/8613* (2013.01)

(58) Field of Classification Search
CPC ............. H01L 29/0834; H01L 29/0847; H01L 29/7397; H01L 29/069; H01L 29/1095; H01L 29/407; H01L 29/16; H01L 29/1608; H01L 29/2003; H01L 27/0664; H01L 29/0696; H01L 29/063
See application file for complete search history.

(56) References Cited

U.S. PATENT DOCUMENTS 6,768,168 B1 * 7/2004 Takahashi ......... H01L 29/66348
257/329
6,781,200 B2 * 8/2004 Ishimura ............. H01L 29/0696
257/329

(Continued)

FOREIGN PATENT DOCUMENTS

JP 2007-311627 A 11/2007

*Primary Examiner* — Bac H Au

(57) ABSTRACT

A semiconductor device includes: a semiconductor substrate including a drift region of a first conductivity type; an emitter region of the first conductivity type provided above the drift region inside the semiconductor substrate and having an impurity concentration higher than the drift region; a base region of a second conductivity type provided between the emitter region and the drift region inside the semiconductor substrate; an accumulation region of the first conductivity type provided between the base region and the drift region inside the semiconductor substrate and having an impurity concentration higher than the drift region; and a plurality of trench sections provided to pass through the emitter region, the base region and the accumulation region from an upper surface of the semiconductor substrate and provided with a conductive section therein. A length of the accumulation region in a depth direction of the semiconductor substrate is less than 1.5 µm.

4 Claims, 8 Drawing Sheets

(51) Int. Cl.
*H01L 29/10* (2006.01)
*H01L 29/739* (2006.01)
*H01L 29/423* (2006.01)
*H01L 27/07* (2006.01)
*H01L 29/08* (2006.01)
H01L 29/40 (2006.01)
H01L 29/16 (2006.01)
H01L 29/20 (2006.01)
H01L 29/861 (2006.01)

(56) References Cited

U.S. PATENT DOCUMENTS

| | | | |
|---|---|---|---|
| 2006/0292805 A1* | 12/2006 | Kawamura | H01L 29/165 |
| | | | 438/292 |
| 2007/0267663 A1 | 11/2007 | Harada | |
| 2014/0048847 A1* | 2/2014 | Yamashita | H01L 29/407 |
| | | | 257/140 |
| 2016/0163696 A1* | 6/2016 | Takahashi | H01L 27/0635 |
| | | | 257/140 |
| 2016/0336393 A1* | 11/2016 | Kim | H01L 29/0619 |
| 2016/0336404 A1* | 11/2016 | Naito | H01L 29/7397 |
| 2016/0351561 A1* | 12/2016 | Senoo | H01L 29/872 |

\* cited by examiner

SEMICONDUCTOR DEVICE

The contents of the following Japanese patent application(s) are incorporated herein by reference:
NO. 2016-175099 filed in JP on Sep. 7, 2016.

BACKGROUND

1. Technical Field

The present invention relates to a semiconductor device.

2. Related Art

Conventionally, in a semiconductor device such as an IGBT (insulated gate bipolar transistor), a structure is known which includes an n-type region of a high concentration formed below a p-type base region (for example, refer to Patent Document 1).
Patent Document 1: Japanese Patent Application Publication No. 2007-311627

In the semiconductor device such as the IGBT provided with the n-type region having a high concentration, each characteristic is improved without excessively increasing a turn-on di/dt.

SUMMARY

In one aspect of the present invention, provided is a semiconductor device. The semiconductor device may include a semiconductor substrate including a drift region of a first conductivity type. The semiconductor device may include an emitter region of the first conductivity type provided above the drift region inside the semiconductor substrate and having an impurity concentration higher than the drift region. The semiconductor device may include a base region of a second conductivity type provided between the emitter region and the drift region inside the semiconductor substrate. The semiconductor device may include an accumulation region of the first conductivity type provided between the base region and the drift region inside the semiconductor substrate and having an impurity concentration higher than the drift region. The semiconductor device may include a plurality of trench sections provided to pass through the emitter region, the base region and the accumulation region from an upper surface of the semiconductor substrate and provided with a conductive section therein. A length of the accumulation region in a depth direction of the semiconductor substrate may be less than 1.5 μm.

An integrated concentration obtained by integrating impurity concentrations of the accumulation region in the depth direction of the semiconductor substrate may be $1.2 \times 10^{13}/cm^2$ or more and $1.8 \times 10^{13}/cm^2$ or less. An impurity concentration distribution in the accumulation region in the depth direction of the semiconductor substrate may have a flat region having substantially constant impurity concentrations. A length of the flat region in the depth direction of the semiconductor substrate may be a half or more of a length of the accumulation region in the depth direction of the semiconductor substrate.

The summary clause does not necessarily describe all necessary features of the embodiments of the present invention. The present invention may also be a sub-combination of the features described above.

DESCRIPTION OF EXEMPLARY EMBODIMENTS

Hereinafter, the present invention is described through the embodiments of the invention. However, the following embodiments are not to limit the claimed invention. Also, all of combinations of features described in the embodiments are not necessarily required for a means for solving problems of the invention.

Figure 1:
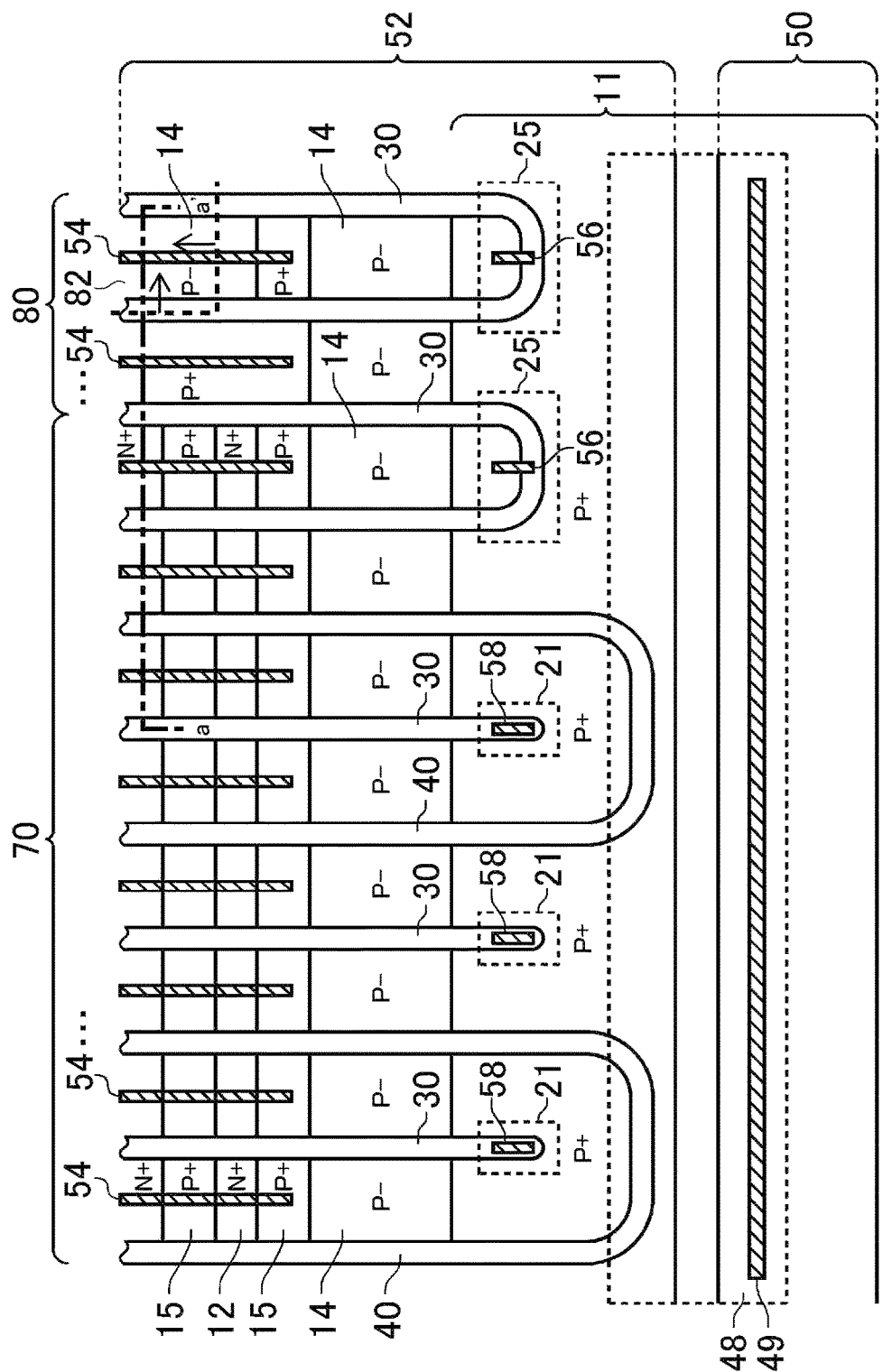
FIG. 1 is a diagram illustrating a part of an upper surface of a semiconductor device 100 according to the embodiment of the present invention.

FIG. 1 is a diagram illustrating a part of an upper surface of a semiconductor device 100 according to the embodiment of the present invention. The semiconductor device 100 of the present example is a semiconductor chip including a transistor section 70 which includes a transistor such as an IGBT and a diode section 80 which includes a diode such as an FWD (Free Wheel Diode). The diode section 80 is formed to be adjacent to the transistor section 70 on an upper surface of a semiconductor substrate. FIG. 1 illustrates an upper surface of the chip around an end portion of the chip and omits other regions.

Also, while FIG. 1 illustrates an active region of the semiconductor substrate of the semiconductor device 100, the semiconductor device 100 may include an edge termination structure section which surrounds the active region. The active region refers to a region in which a current flows when the semiconductor device 100 is controlled in an ON state. The edge termination structure section reduces an electric field concentration at an upper-surface side of the semiconductor substrate. The edge termination structure section has a structure of, for example, a guard ring, a field plate, an RESURF, and a combination thereof.

The semiconductor device 100 of the present example includes a gate trench section 40 formed inside the upper-surface side of the semiconductor substrate, a dummy trench section 30, a well region 11, an emitter region 12, a base region 14 and a contact region 15. Also, the semiconductor device 100 of the present example includes an emitter electrode 52 and a gate metal layer 50 provided above the upper surface of the semiconductor substrate. The emitter electrode 52 and the gate metal layer 50 are provided to be separated from each other. The gate trench section 40 and the dummy trench section 30 are one example of the trench section.

An interlayer insulating film is formed between the emitter electrode 52 and the gate metal layer 50, and the upper surface of the semiconductor substrate, but is omitted from FIG. 1. In the interlayer insulating film of the present example, a contact hole 56, a contact hole 58, a contact hole 49 and a contact hole 54 are formed to pass through the interlayer insulating film.

The emitter electrode 52 contacts the emitter region 12, the contact region 15 and the base region 14 on the upper surface of the semiconductor substrate through the contact hole 54. Also, the emitter electrode 52 is connected to a dummy conductive section within the dummy trench section 30 through the contact hole 56 and the contact hole 58. A connection section 21 and a connection section 25 may be provided between the emitter electrode 52 and the dummy conductive section, which is formed of conductive material such as polysilicon doped with impurities. The connection section 21 and the connection section 25 are formed on the upper surface of the semiconductor substrate.

The gate metal layer 50 contacts a gate runner 48 through the contact hole 49. The gate runner 48 is formed of polysilicon doped with impurities, or the like. The gate runner 48 is connected to a gate conductive section within the gate trench section 40 on the upper surface of the semiconductor substrate. The gate runner 48 is not connected to the dummy conductive section within the dummy trench section 30. The gate runner 48 of the present example is formed from below the contact hole 49 to an edge portion of the gate trench section 40. At the edge portion of the gate trench section 40, the gate conductive section is exposed to the upper surface of the semiconductor substrate and contacts the gate runner 48.

The emitter electrode 52 and the gate metal layer 50 are formed of metal-containing material. For example, at least some regions of each electrode are formed of aluminum or aluminum-silicon alloy. Each electrode may include a barrier metal formed of titanium, titanium compound or the like in a lower layer of a region formed of aluminum or the like, and may also include a plug formed of tungsten or the like in the contact hole.

One or more gate trench sections 40 and one or more dummy trench sections 30 are arranged at a predetermined interval along a predetermined arrangement direction in a region of the transistor section 70. In the transistor section 70, one or more gate trench sections 40 and one or more dummy trench sections 30 may be formed alternately along the arrangement direction.

The gate trench section 40 of the present example may include two extending portions which extend along an extending direction perpendicular to the arrangement direction and a connecting portion which connects two extending portions. At least part of the connecting portion is preferably formed in a curved shape. By connecting end portions of two extending portions of the gate trench section 40, the electric field concentration at the end portions of the extending portions can be reduced. The gate runner 48 may be connected to the gate conductive section at the connecting portion of the gate trench section 40.

The dummy trench section 30 of the present example is provided between the respective extending portions of the gate trench section 40. These dummy trench sections 30 may have a straight shape to extend in the extending direction.

Note that in the transistor section 70, a plurality of dummy trench sections 30 may be arranged serially at a boundary with the diode section 80. The dummy trench section 30 formed at the boundary portion may also include the extending portions and the connecting portion. The dummy trench section 30 including the connecting portion and the dummy trench section 30 having a straight shape may have the same length in the extending direction.

The number of dummy trench sections 30 arranged serially at the boundary with the diode section 80 may be greater than the number of dummy trench sections 30 arranged serially inside the transistor section 70 and away from the diode section 80. Note that the number of trench sections refers to the number of extending portions of the trench sections arranged in the arrangement direction.

In the example of FIG. 1, in the transistor section 70 at the boundary with the diode section 80, two dummy trench sections 30 are arranged serially. On the other hand, inside the transistor section 70, the gate trench sections 40 and the dummy trench sections 30 are arranged alternately one by one.

The emitter electrode 52 is formed above the gate trench section 40, the dummy trench section 30, the well region 11, the emitter region 12, the base region 14 and the contact region 15. The well region 11 is formed within a predetermined range from an end portion of the active region at a side provided with the gate metal layer 50. A diffusion depth of the well region 11 may be greater than depths of the gate trench section 40 and the dummy trench section 30. Some regions of the gate trench section 40 and the dummy trench section 30 at the side of the gate metal layer 50 are formed in the well region 11. A bottom of an end of the dummy trench section 30 in the extending direction may be covered by the well region 11.

The base region 14 is formed in a mesa portion positioned between the respective trench sections. The base region 14 is of a second conductivity type and has an impurity concentration lower than the well region 11. The base region 14 of the present example is of a (P−)-type.

The contact region 15 of the second conductivity type is formed on an upper surface of the base region 14 in the mesa portion, where the contact region 15 has an impurity concentration higher than the base region 14. The contact region 15 of the present example is of a (P+)-type. Also, in the transistor section 70, the emitter region 12 of the first conductivity type is selectively formed on a part of an upper surface of the contact region 15, where the emitter region 12 has an impurity concentration higher than the semiconductor substrate. The emitter region 12 of the present example is of an (N+)-type.

Each of the contact region 15 and the emitter region 12 is formed to extend from one of the adjacent trench sections to the other. One or more contact regions 15 and one or more emitter regions 12 of the transistor section 70 are formed to be exposed to an upper surface of the mesa portion alternately along the extending direction of the trench section.

In another example, in the mesa portion of the transistor section 70, the contact regions 15 and the emitter regions 12 may also be formed in a striped pattern along the extending direction. For example, the emitter region 12 is formed in a region adjacent to the trench section and the contact region 15 is formed in a region positioned between the emitter regions 12.

The emitter region 12 is not formed in the mesa portion of the diode section 80. Also, in the mesa portion of the diode section 80, the contact region 15 is formed in a region opposed to at least one contact region 15 in the transistor section 70.

In the transistor section 70, the contact hole 54 is formed above each region of the contact region 15 and the emitter region 12. The contact hole 54 is not formed in a region which corresponds to the base region 14 or the well region 11.

In the diode section 80, the contact hole 54 is formed above the contact region 15 and the base region 14. The contact hole 54 of the present example is not formed for the base region 14 closest to the gate metal layer 50, among a plurality of base regions 14 in the mesa portion of the diode section 80. In the present example, the contact hole 54 of the transistor section 70 and the contact hole 54 of the diode section 80 have the same length in the extending direction of each trench section.

Figure 2:
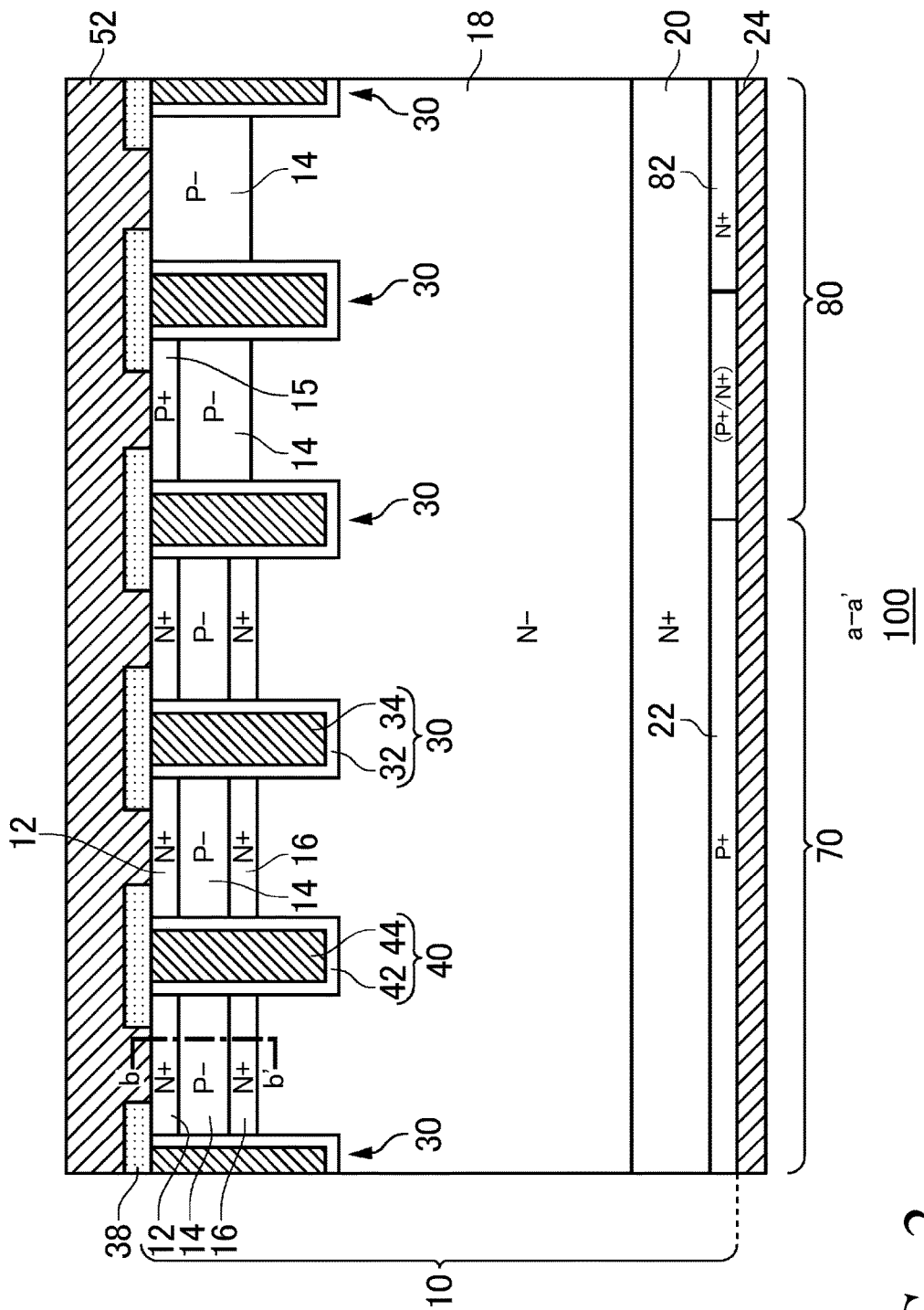
FIG. 2 is a diagram illustrating one example of the a-a' cross section in FIG. 1.

FIG. 2 is a diagram illustrating one example of the a-a' cross section in FIG. 1. The semiconductor device 100 of the present example includes, in the cross section, a semiconductor substrate 10, an interlayer insulating film 38, the emitter electrode 52 and a collector electrode 24. The emitter electrode 52 is formed on an upper surface of the semiconductor substrate 10 and the interlayer insulating film 38.

The collector electrode 24 is formed on a lower surface of the semiconductor substrate 10. The emitter electrode 52 and the collector electrode 24 are formed of conductive material such as metal. As used herein, a direction connecting the emitter electrode 52 and the collector electrode 24 is referred to as a depth direction.

The semiconductor substrate 10 may be a silicon substrate, may be a silicon carbide substrate, or may be a nitride semiconductor substrate such as gallium nitride or the like. The semiconductor substrate 10 of the present example is a silicon substrate. The base region 14 of the (P−)-type is formed at an upper-surface side of the semiconductor substrate 10.

In the cross section, at an upper-surface side of the transistor section 70, the emitter region 12 of the (N+)-type, the base region 14 of the (P−)-type and the accumulation region 16 of the (N+)-type are formed in order from the upper-surface side of the semiconductor substrate 10.

In the cross section, the base region 14 of the (P−)-type is formed at an upper-surface side of the diode section 80. The accumulation region 16 may not be formed in the diode section 80. Also, the contact region 15 is formed on an upper surface of a mesa portion adjacent to the transistor section 70.

In the transistor section 70, the drift region 18 of an (N−)-type is formed on a lower surface of the accumulation region 16. The accumulation region 16 having a concentration higher than the drift region 18 is provided between the drift region 18 and the base region 14, thereby increasing a carrier implantation enhanced effect (IE effect) and reducing an ON voltage.

The accumulation region 16 is formed in each mesa portion of the transistor section 70. The accumulation region 16 may be provided to cover the entire lower surface of the base region 14 in each mesa portion. In the diode section 80, the drift region 18 is formed on a lower surface of the base region 14. In both of the transistor section 70 and the diode section 80, a buffer region 20 of the (N+)-type is formed on a lower surface of the drift region 18.

The buffer region 20 is formed at a lower-surface side of the drift region 18. An impurity concentration of the buffer region 20 is higher than an impurity concentration of the drift region 18. The buffer region 20 may work as a field stop layer to prevent a depletion layer expanded from a lower-surface side of the base region 14 from reaching a collector region 22 of the (P+)-type and a cathode region 82 of the (N+)-type.

In the transistor section 70, the collector region 22 of the (P+)-type is formed on a lower surface of the buffer region 20. In the diode section 80, the cathode region 82 of the (N+)-type is formed on a lower surface of the buffer region 20. The cathode region 82 may be inside dashed lines illustrated in FIG. 1. That is, a position on the upper surface of the semiconductor 10, to which the cathode region 82 is projected may be the mesa portion to which the base region of the (P−)-type is exposed and the dummy trench section 30 in contact with the mesa portion in the diode region 80, and the cathode region 82 may be shown at an upper side in FIG. 1 than the contact region 15 of the (P+)-type. Note that in the mesa portion in the diode region 80, the collector region 22 of the transistor section 70 may extend and the cathode region 82 may be formed in the mesa portion adjacent to the transistor section 70 at the lower-surface side thereof.

One or more gate trench sections 40 and one or more dummy trench sections 30 are formed at the upper-surface side of the semiconductor substrate 10. Each trench section passes through the base region 14 from the upper surface of the semiconductor substrate 10 and reaches the drift region 18. For regions provided with at least either of the emitter region 12, the contact region 15 and the accumulation region 16, each trench section also passes through these regions and reaches the drift region 18. The configuration in which the trench section passes through the impurity region is not limited to the one manufactured by forming the trench section after forming the impurity region. The configuration by forming the impurity region between trench sections after forming the trench sections also falls within the configuration in which the trench section passes through the impurity region.

The gate trench section 40 includes a gate trench, a gate-insulating film 42 and a gate conductive section 44 formed at the upper-surface side of the semiconductor substrate 10. The gate-insulating film 42 is formed to cover an inner wall of the gate trench. The gate-insulating film 42 may be formed by oxidizing or nitriding semiconductors on the inner wall of the gate trench. The gate conductive section 44 is formed inside the gate trench at a more inner side than the gate-insulating film 42. That is, the gate-insulating film 42 insulates the gate conductive section 44 from the semiconductor substrate 10. The gate conductive section 44 is formed of conductive material such as polysilicon.

The gate conductive section 44 includes a region at least opposed to the base region 14 adjacent in the depth direction. The gate trench section 40 in the cross section is covered by the interlayer insulating film 38 on the upper surface of the semiconductor substrate 10. When a predetermined voltage is applied to the gate conductive section 44, a channel is formed on a surface layer of an interface of the base region 14 which contacts the gate trench.

The dummy trench section 30 may have the same structure as the gate trench section 40 in the cross section. The dummy trench section 30 includes a dummy trench, a dummy insulating film 32 and a dummy conductive section 34 formed at the upper-surface side of the semiconductor substrate 10. The dummy insulating film 32 is formed to cover an inner wall of the dummy trench. The dummy conductive section 34 is formed inside the dummy trench and formed at a more inner side than the dummy insulating film 32. The dummy insulating film 32 insulates the dummy conductive section 34 from the semiconductor substrate 10. The dummy conductive section 34 may be formed of the same material as the gate conductive section 44. For example, the dummy conductive section 34 is formed of conductive material such as polysilicon. The dummy conductive section 34 may have the same length as the gate conductive section 44 in the depth direction. The dummy trench section 30 in the cross section is covered by the interlayer insulating film 38 on the upper surface of the semiconductor substrate 10.

Figure 3:
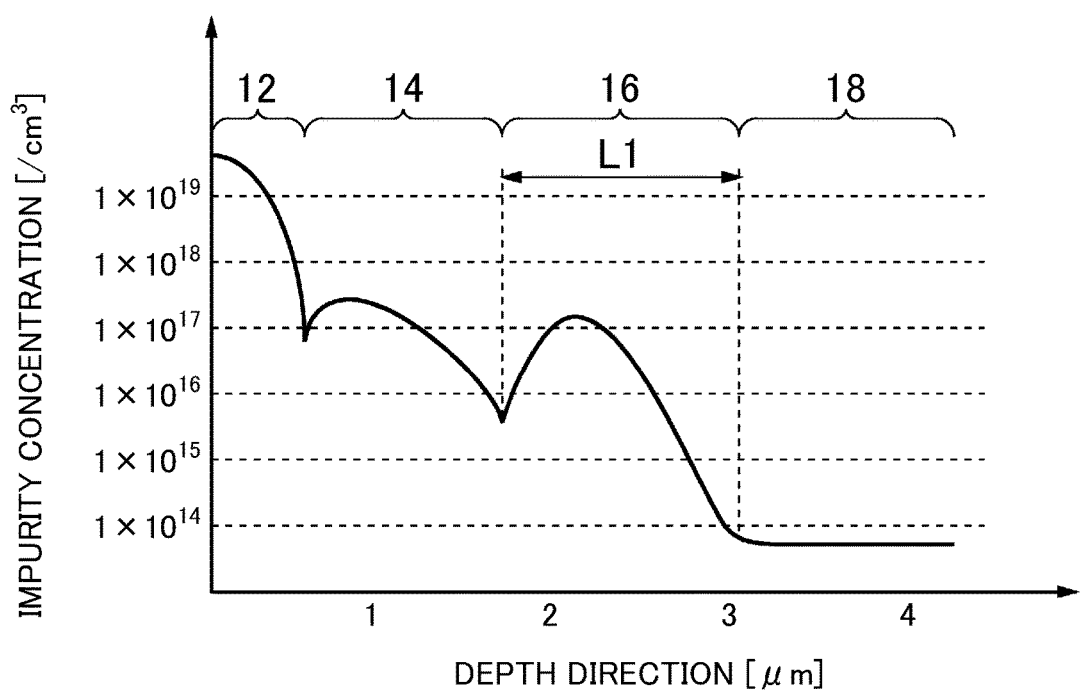
FIG. 3 is a diagram illustrating an impurity concentration distribution in a depth direction of the b-b cross section shown in FIG. 2.

FIG. 3 is a diagram illustrating an impurity concentration distribution in a depth direction of the b-b cross section shown in FIG. 2. As shown in FIG. 3, the vertical axis of a diagram illustrating a concentration of impurities is a logarithmic axis. As used herein, an impurity concentration refers to a concentration of impurities transformed to donors or acceptors. The impurity concentration shown in FIG. 3 corresponds to a difference between concentrations of donors and acceptors.

A length of the accumulation region 16 in the depth direction is defined as L1. An upper end of the accumulation region 16 is a boundary portion with the base region 14, and is a position indicating a local minimum value of the impurity concentration distribution shown in FIG. 3. A lower end of the accumulation region 16 is a boundary portion with the drift region 18. However, if a boundary between the accumulation region 16 and the drift region 18 cannot be defined clearly, a position at which an impurity concentration is one-tenth or a position at which an impurity concentration is one-half of the maximum value of the impurity concentration of the accumulation region 16 may be used as the lower end of the accumulation region 16.

By providing the accumulation region 16, an ON voltage Von of the semiconductor device 100 can be reduced. However, if the accumulation region 16 is formed to an excessively deep position, di/dt indicating a gradient of changes in currents in the turn-on process is excessively increased, which results in unstable operations of the circuit. Therefore, the length L of the accumulation region 16 of the present example is less than 1.5 μm. As a result, by providing the accumulation region 16, it is possible to suppress an excessive increase in di/dt, while improving the characteristics such as the ON voltage Von. Note that the lower limit of the length L may be about 0.5 μm or may be about 0.8 μm.

Figure 4:
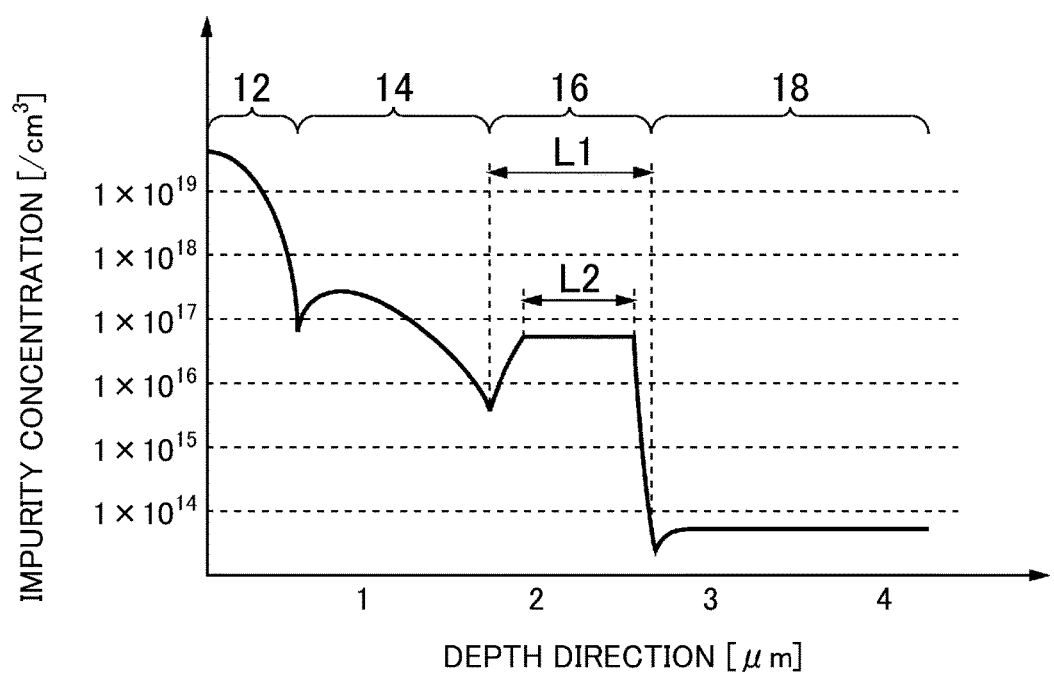
FIG. 4 is a diagram illustrating another example of the impurity concentration distribution in the depth direction.

FIG. 4 is a diagram illustrating another example of the impurity concentration distribution in the depth direction. The accumulation region 16 of the present example may include a flat region in which an impurity concentration distribution is substantially constant in the depth direction. A length of the flat region in the depth direction is defined as L2. The length L2 of the flat region may be approximately equal to the length L1 of the entire accumulation region 16. The length L2 of the flat region may be a half or more, may be 70% or more, or may be 90% or more of the length L1 of the accumulation region 16.

In this manner, by providing the flat region in the accumulation region 16, it is possible to increase the concentration in the entire accumulation region 16. As a result, even if the accumulation region 16 formed to have a small length in the depth direction is used, the integrated concentration of the accumulation region 16 can easily be increased. Therefore, without the turn-on di/dt excessively increased, it is possible to improve the characteristics such as the ON voltage Von.

For example, the integrated concentration of the accumulation region 16 is $1.0 \times 10^{13}/cm^2$ or more and $1.8 \times 10^{13}/cm^2$ or less. An upper limit of the integrated concentration may also be $1.3 \times 10^{13}/cm^2$. By setting the integrated concentration within such a range, it is possible to suppress an excessive increase in di/dt, while improving the characteristics such as the ON voltage Von. The impurity concentration of the flat region of the present example is $1.0 \times 10^{17}/cm^3$ and the length L2 is 1.3 μm. The integrated concentration of the accumulation region 16 is approximately equal to the integrated concentration of the flat region, about $1.3 \times 10^{13}/cm^2$.

Figure 5:
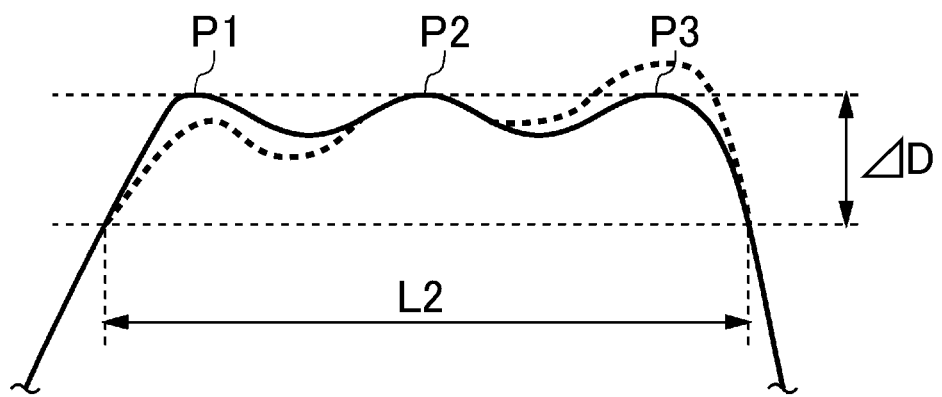
FIG. 5 is a diagram illustrating one example of the impurity concentration distribution in the depth direction in the flat region in the accumulation region 16.

FIG. 5 is a diagram illustrating one example of the impurity concentration distribution in the depth direction in the flat region in the accumulation region 16. The impurity concentration distribution in the flat region may not include strictly constant impurity concentrations. The flat region is a region which includes a peak P of the impurity concentration of the accumulation region 16 and is continuous in the depth direction, and a region which has impurity concentrations within a predetermined fluctuating range ΔD from the peak P. The fluctuating range ΔD may be a range within 50% or more, may be a range within 70% or more, or may be a range within 90% or more of the impurity concentration at the peak P.

Also, the impurity concentration distribution of the flat region may include a plurality of peaks P. In the example of FIG. 5, three peaks P1, P2, P3 are included. The flat region includes a plurality of peaks P so that the flat region can easily be formed if the accumulation region 16 is formed by ion implantation. For example, by implanting respective positions of a plurality of peaks P with protons or impurity ions such as phosphorous ions, the flat region can easily be formed. In this case, it is preferable to adjust an interval of the respective peaks P such that the impurity concentration between two peaks falls within the fluctuating range ΔD. Also, a plurality of peaks may not correspond to the same concentration. For example, as illustrated by dotted lines, the peak closest to the upper-surface side of the semiconductor substrate 10 may correspond to the lowest concentration. Alternatively, the peak closest to the lower-surface side of the semiconductor substrate 10 may correspond to the lowest concentration. Alternatively, if three or more peaks are provided, any of intermediate peaks may correspond to a lower concentration than those of the peaks closest to the upper-surface side of the semiconductor substrate 10 and the lower-surface side of the semiconductor substrate 10.

Figure 6:
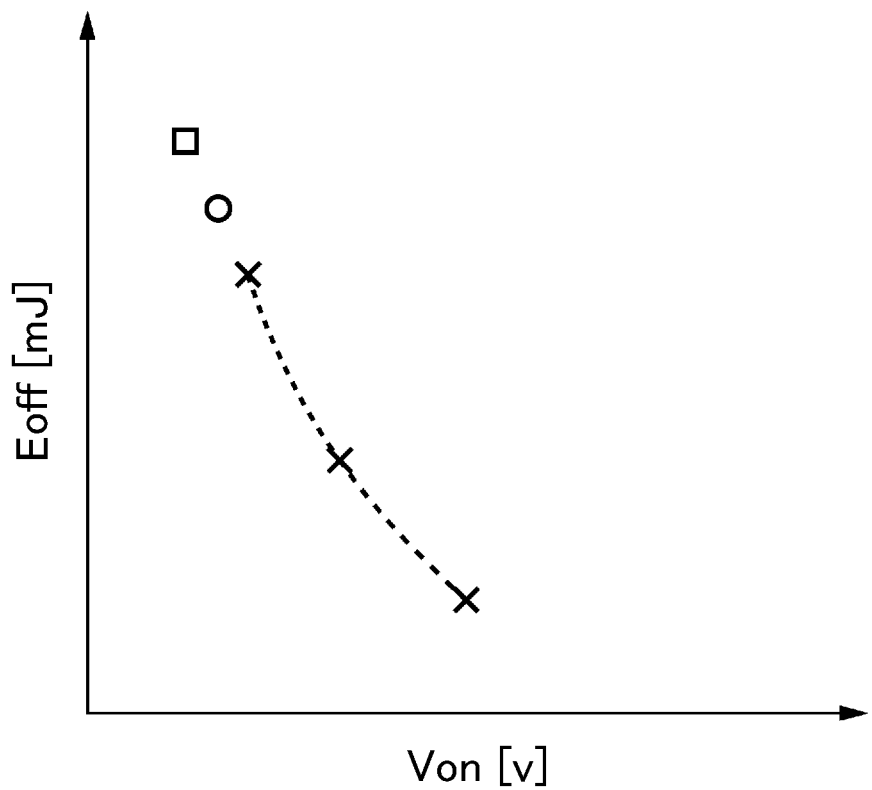
FIG. 6 is a diagram illustrating the relation between the ON voltage Von and a turn-off loss Eoff of the semiconductor device 100.

FIG. 6 is a diagram illustrating the relation between the ON voltage Von and a turn-off loss Eoff of the semiconductor device 100. In the present example, as shown in FIG. 4, an example of the semiconductor device 100 including the flat region in the accumulation region 16 is illustrated. In a graph in FIG. 6, a square-shaped plot corresponds to an example for the impurity concentration of the flat region of $1.0 \times 10^{17}/cm^3$ and the length L2 of 1.3 μm, while a circular-shaped plot corresponds to an example for the impurity concentration of the flat region of $1.0 \times 10^{17}/cm^3$ and the length L2 of 0.8 μm. Also, the semiconductor device of the example in FIG. 3 is illustrated by a cross-shaped plot.

As shown in FIG. 6, by providing the flat accumulation region 16, the ON voltage Von can be reduced. Also, by forming the accumulation region 16 to be long, the ON voltage Von is reduced.

Figure 7:
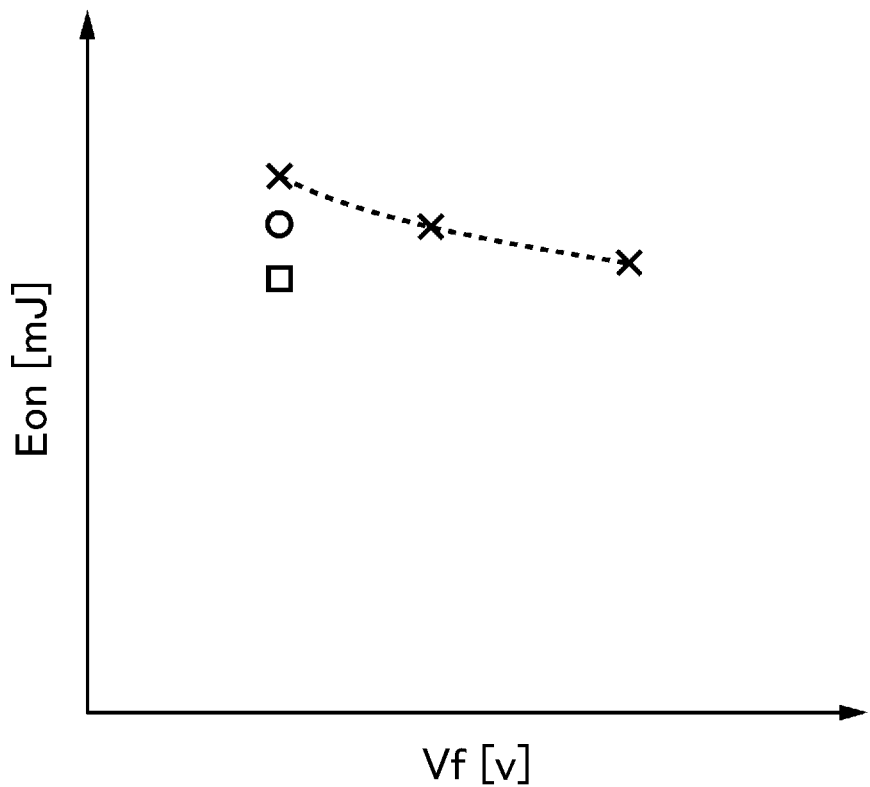
FIG. 7 is a diagram illustrating the relation between a forward-direction voltage Vf and a turn-on loss Eoff of a built-in diode of the semiconductor device 100.

FIG. 7 is a diagram illustrating the relation between a forward-direction voltage Vf and a turn-on loss Eon of a built-in diode of the semiconductor device 100. Each plot in FIG. 7 corresponds to each plot in FIG. 6. As shown in FIG. 7, by providing the accumulation region 16, the turn-on loss Eon can be reduced against the same forward-direction voltage Vf.

Figure 8:
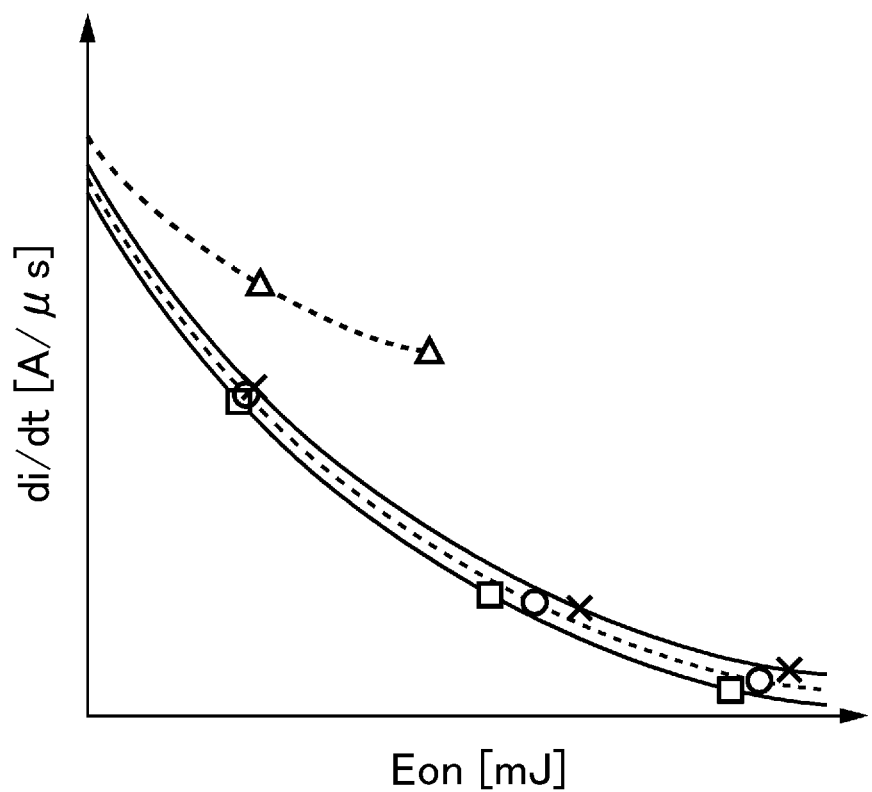
FIG. 8 is a diagram illustrating the relation between the turn-on loss Eon and the turn-off di/dt in the semiconductor device 100.

FIG. 8 is a diagram illustrating the relation between the turn-on loss Eon and the turn-on di/dt in the semiconductor device 100. FIG. 8 illustrates a comparative example for the impurity concentration of the flat region of $1.0 \times 10^{17}/cm^3$ and the length L2 of 2.3 μm by a triangular plot, in addition to the examples illustrated in FIG. 6 and FIG. 7.

As shown in FIG. 8, if the accumulation region 16 is formed excessively long, the turn-on di/dt is excessively increased. Therefore, preferably, the length L of the accumulation region 16 is less than 1.5 μm. Also, the length L2 of the flat region of the accumulation region 16 may also be less than 1.5 μm. The length L of the accumulation region 16 may be 1.3 μm or less. Also, the length L2 of the flat region of the accumulation region 16 may also be 1.3 μm or less.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A semiconductor device comprising:
a semiconductor substrate including a drift region of a first conductivity type;
an emitter region of the first conductivity type provided above the drift region and having an impurity concentration higher than the drift region;
a base region of a second conductivity type provided between the emitter region and the drift region;
an accumulation region of the first conductivity type provided between the base region and the drift region inside the semiconductor substrate and having an impurity concentration higher than the drift region; and
a plurality of trench sections provided to pass through the emitter region, the base region and the accumulation region from an upper surface of the semiconductor substrate and provided with a conductive section therein; wherein
a length of the accumulation region in a depth direction of the semiconductor substrate is less than 1.5 μm,
an impurity concentration distribution in the accumulation region in the depth direction of the semiconductor substrate has a substantially flat region having substantially constant impurity concentrations, the substantially constant impurity concentrations in the substantially flat region having two or more peaks,
the substantially flat region occupies a length in the depth direction within the accumulation region throughout which an impurity concentration is 50% or more of the highest impurity concentration of the two or more peaks, and
the length of the substantially flat region in the depth direction of the semiconductor substrate is a half or more of a length of the accumulation region in the depth direction of the semiconductor substrate and is equal to or less than the length of the accumulation region.

2. The semiconductor device according to claim 1, wherein an integrated concentration obtained by integrating impurity concentrations of the accumulation region in the depth direction of the semiconductor substrate is $1.2 \times 10^{13}/\text{cm}^2$ or more and $1.8 \times 10^{13}/\text{cm}^2$ or less.

3. The semiconductor device according to claim 1, wherein the accumulation region is provided between and in direct contact with the base region and the drift region.

4. The semiconductor device according claim 3, wherein the length of the substantially flat region in the depth direction of the semiconductor substrate is equal to the length of the accumulation region in the depth direction of the semiconductor substrate.

* * * * *